United States Patent [19]

Hiramoto

[11] Patent Number: 4,468,260
[45] Date of Patent: Aug. 28, 1984

[54] METHOD FOR DIFFUSING DOPANT ATOMS

[75] Inventor: Tatsumi Hiramoto, Tokyo, Japan

[73] Assignee: Ushio Denki Kabushiki Kaisha, Tokyo, Japan

[21] Appl. No.: 480,082

[22] Filed: Mar. 29, 1983

[30] Foreign Application Priority Data

Jun. 22, 1982 [JP] Japan .................. 57-106189

[51] Int. Cl.³ .................... H01L 21/22; H01L 21/265
[52] U.S. Cl. ..................................... 148;1.5; 148/186; 148/188; 29/576 T
[58] Field of Search ............... 148/188, 186, 1.5; 29/576 T

[56] References Cited

U.S. PATENT DOCUMENTS

| | | | |
|---|---|---|---|
| 3,589,949 | 6/1971 | Nelson | 148/186 X |
| 3,627,590 | 12/1971 | Mammel | 148/1.5 |
| 4,001,047 | 1/1977 | Boah | 148/188 X |
| 4,012,236 | 3/1977 | Anthony et al. | 148/1.5 |
| 4,016,006 | 4/1977 | Yoshinaka et al. | 148/1.5 |
| 4,170,490 | 10/1979 | Anthony et al. | 148/187 X |
| 4,370,174 | 1/1983 | Levotter | 148/1.5 |
| 4,415,372 | 11/1983 | Koshino et al. | 29/576 T |

Primary Examiner—G. Ozaki
Attorney, Agent, or Firm—Ziems, Walter & Shannon

[57] ABSTRACT

Dopant atoms are diffused into a silicon wafer by heating the entirety of the silicon wafer with the dopant atoms to a predetermined diffusing temperature in a short period of time, and more specifically, by applying light onto the silicon wafer under such conditions that the temperature difference between a central part of the silicon wafer and its peripheral part is maintained within 65° C. The above diffusion method permits to carry out diffusion of the dopant atoms into silicon wafers with high productivity but without inducing physical defects such as warping or slip lines. It requires a very short time period for effecting diffusion to a desired extent and it enables to make the depth of diffusion greater.

10 Claims, 1 Drawing Figure

METHOD FOR DIFFUSING DOPANT ATOMS

BACKGROUND OF THE INVENTION

(1) Field of the Invention

This invention relates to a method for diffusing dopant atoms such as aluminum, gallium, phosphorus or the like thermally into the interior of a semiconductor wafer of silicon.

(2) Description of the Prior Art

The thermal diffusion technique is currently used in the fabrication of integrated circuits, large-scale integrated circuits and the like so as to form layers doped with dopant atoms. The thermal diffusion technique permits to form a junction of a doped layer in a silicon wafer. It also enables to form such a junction at a greater depth of the wafer.

As a method for causing dopant atoms to undergo thermal diffusion into the interior of a silicon wafer, it has heretofore been carried out to heat the silicon wafer with the dopant atoms in a resistive furnace. It is however necessary, according to the above conventional method, to carry out the heating of the silicon wafer at a temperature of about 1100° C. and for a time period as long as about 10 hours in order to achieve a desired level of diffusion, although the diffusing temperature and time may vary to certain extents depending on the sort of dopant atoms to be diffused. Moreover, it is also required to conduct the temperature-raising step of the silicon wafer from room temperature to a diffusing temperature where the dopant atoms are caused to undergo diffusion, and the temperature-lowering step of the same silicon wafer from the diffusing temperature to room temperature respectively before and after the diffusion treatment slowly, each, over a time period of 1 hour or longer, thereby making the overall diffusion treatment very time-consuming.

The above-described thermal diffusion method making use of a resistance furnace is superior in that a number of wafers may be subjected to a diffusion treatment at once and, because wafers are heated for a long period of time making use of the thermal conduction by means of the surrounding gas, temperature variations may be kept relatively small at various points of each wafer. The above conventional method is however accompanied by such drawbacks that the wafers often develop crystal defects because they are kept for a long time period at a high temperature and wafers may develop other physical defects such as warping if they are charged or discharged at a higher speed into or from a furnace with a view toward making the treatment time shorter.

With the foregoing in view, it may be contemplated to effect the diffusion at a higher temperature so as to shorten the treatment time. However, the diffusing temperature is said to be 1200° C. or so at most, because the heat treatment of silicon wafers is generally conducted while holding them in a container formed of a high-purity silicon glass tube and any temperatures higher than the melting point of silicon must thus be avoided. Use of phosphorus as a dopant still requires a considerably long time period, i.e., 4 hours for its diffusion even if silicon wafers are heated at a treatment temperature of 1200° C. Furthermore, the problem of developing physical defects such as warping remain unsolved even if the diffusing treatment is carried out at such a high temperature.

When increasing the depth of diffusion, for example, to 10 μm or so from the surface of a wafer by the above-described thermal diffusion method making use of a resistance furnace, it is necessary to make the diffusing temperature still higher and the treatment time still longer. The above-mentioned drawbacks become serious problems if the diffusing temperature and time are increased. Therefore, the conventional diffusion method, which uses a resistance furnace, cannot be considered as a meritorious method in view of its productivity and production yield.

SUMMARY OF THE INVENTION

The present invention has been completed taking the foregoing into consideration. An object of this invention is accordingly to provide a novel diffusion method of dopant atoms which method does not induce warping and other physical defects of the silicon wafers and correspondingly enjoys high productivity.

Another object of this invention is to provide a diffusion method of dopant atoms which method requires a shorter time period but brings about a greater diffusing depth of the dopant atoms.

In one aspect of this invention, there is thus provided a method for diffusing dopant atoms into a silicon wafer, which method comprises heating the entirety of said silicon wafer with said dopant atoms to a predetermined diffusing temperature in a short period of time by applying light thereonto under such conditions that the temperature difference between a central part and a peripheral part of the silicon wafer is maintained not more than 65° C. throughout the treatment, thereby causing said dopant atoms to undergo thermal diffusion into the interior of said silicon wafer.

The diffusion method of dopant atoms according to the present invention permits, as will be apparent from Examples which will be described later in this specification, to carry out diffusion of the dopant into silicon wafers with high productivity without inducing any physical defects such as warping and slip lines. In addition, it requires a very short time period for effecting diffusion to a desired extent and it enables to make the depth of diffusion greater.

The above and other objects, features and advantages of the present invention will become apparent from the following description and the appended claims, taken in conjunction with the accompanying drawing.

DETAILED DESCRIPTION OF THE INVENTION AND PREFERRED EMBODIMENT

Figure 1:
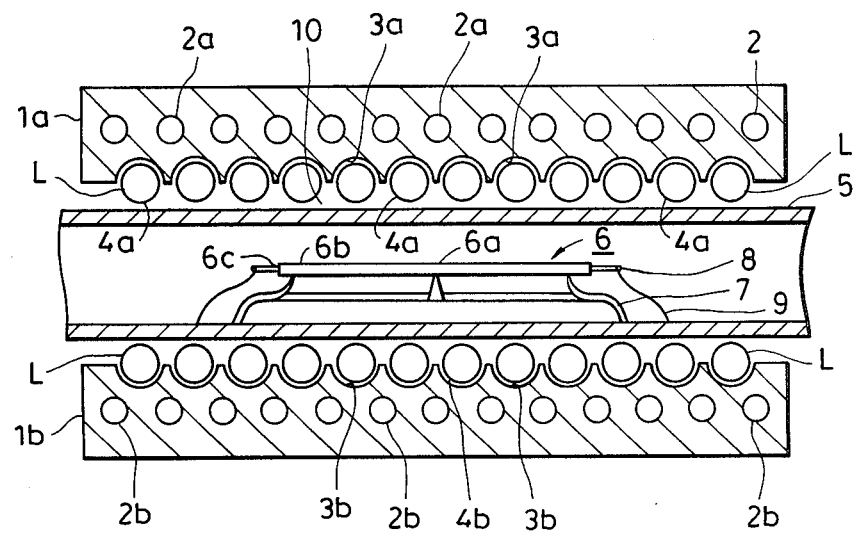
FIG. 1 is a schematic cross-sectional view showing an essential part of a light-heating furnace which may be used suitably in the practice of the method according to this invention.

One embodiment of this invention will hereinafter be described with reference to the accompanying sole drawing, i.e., FIG. 1.

In FIG. 1, numerals 1a,1b indicate respectively upper and lower reflectors arranged in up-and-down and face-to-face relationship with an irradiation space 10 interposed therebetween. The reflectors 1a,1b are provided with flow passages 2a and 2b for cooling water respectively. In the inner surface of each of the reflectors 1a,1b, a plurality of gutter-like grooves 3a,3b (12 grooves in the illustrated embodiment) are formed close and parallel to one another. Tubular halogen lamps 4a,4b are provided in such a state that they are received in their corresponding grooves 3a,3b. The halogen lamps 4a, which correspond to the reflector 1a, are arranged in such a way that their filaments are positioned in a common plane and make up an upper plane light source together with their matching reflector 1a. On the other hand, the halogen lamps 4b, which correspond to the reflector 1b, lie in a common plane which is parallel to the plane in which the filaments of the above-described upper plane light source are positioned. The halogen lamps 4b make up a lower plane light source together with the reflector 1b.

Describing the above light-heating furnace more specifically, each of the halogen lamps 4a,4b is a tubular lamp having a filament which is equipped with alternating luminous parts and nonluminous parts and sealed in a sealed envelope, that are used as an exposure lamp in an electronic copying machine, for example. In an example, the rated power consumption of the lamp is 2 KW. Each of the upper and lower plane light sources is constructed of 12 halogen lamps 4a or 4b disposed with their longitudinal tubular axes parallel to one another. It has an area of 20 cm×25 cm or so.

In the present invention, diffusion of dopant atoms into a silicon wafer is carried out as follows, using, for example, a light-heating furnace having such a structure as mentioned above. Namely, a silicon wafer 6 to be subjected to a diffusion treatment with dopant atoms, which has in advance been introduced into the silicon wafer 6 in accordance with, for instance, the ion implantation process, is supported horizontally on a wafer holder 7 disposed in a transparent container 5. Then, the transparent container 5 is inserted into the irradiation space 10 of the light-heating furnace in such a way that the upper and lower surfaces of the silicon wafer 6 confront parallelly with central regions of their corresponding upper and lower plane light sources. Numeral 8 indicates a substantially annular subsidiary heater which extends along the outer circumference of the silicon wafer 6 and may be provided as needed. The subsidiary heater 8 is supported by support legs 9 in the transparent container 5.

While holding the silicon wafer in the above-mentioned state, all the halogen lamps 4a,4b of the upper and lower plane light sources are turned on at once so that light and heat, which are emitted from the halogen lamps 4a,4b, are applied onto the upper and lower surfaces of the silicon wafer 6, whereby to heat the silicon wafer 6 under such conditions that the temperature difference between a central part 6a of the silicon wafer 6 and its peripheral part 6b (an area within several millimeters from the peripheral edge 6c) does not exceed 65° C. By the above heat treatment, the dopant atoms which have in advance been introduced in the silicon wafer 6 is caused to undergo thermal diffusion.

When heating the silicon wafer 6 in a light-heating furnace as mentioned above, the surface temperature of the silicon wafer 6 can be raised to a temperature as high as 1250° C. or higher within a short period of 10 seconds. It is preferred to make the transparent container 5 and wafer holder 7 with silica glass, because the transparent container 5 and wafer holder 7 are prevented from getting hotter and the silicon wafer 6 may be heated at a faster speed, thereby making it possible to raise the temperature of the silicon wafer 6 to a high temperature of at most 1400° C. in a short period of time.

However, if the silicon wafer 6 is heated rapidly to such a high temperature under ordinary conditions, a greater temperature difference occurs between the central part 6a and the peripheral part 6b of the silicon wafer 6 due to a difference in temperature distribution or temperature-raising speed. Besides, a greater difference may also occur in reachable highest temperature between the central part 6a and the peripheral part 6b of the silicon wafer 6 for the same reasons. Such differences will result in development of not only warping but also a physical defect which is generally called "slip lines". The above temperature difference occurs in the silicon wafer 6 because more heat quantity is radiated outwardly from the peripheral part 6b of the silicon wafer 6 than the central part 6a and the peripheral part 6b is thus heated at a slower temperature-raising speed or to a lower temperature.

Since the above-mentioned heating of the silicon wafer 6 by means of radiated light is effected in the present invention under such conditions that the temperature difference between the central part 6a of the wafer 6 and its peripheral part 6b does not exceed 65° C., the silicon wafer 6 can be heated to high temperatures to cause dopant atoms to undergo diffusion thereinto without inducing any physical defects, i.e., warping or slip lines to occur. The above effect of the present invention has been confirmed through experiments.

The following means are effective to achieve the above-described heating by radiated light while fulfilling the requirement that the temperature difference between the central part 6a of the silicon wafer 6 and its peripheral part 6b be maintained within 65° C.:

(1) To place a silicon wafer having a relatively small diameter compared with the areas of the plane light sources in face-to-face relationship with central regions of the plane light sources.

Supposing that each of the plane light sources has an area of 20 cm×25 cm as mentioned above and the distance between the common plane on which the filament of each of the halogen lamps 4a,4b lies and its corresponding surface of the silicon wafer 6 is for instance 4 cm, the above heating method is effective for silicon wafers having a diameter of 5 inches or smaller.

(2) To provide the subsidiary heater 8 so as to surround the outer circumference of the silicon wafer 6 or allow it to extend along the outer circumference of the silicon wafer 6, whereby additionally heating the peripheral part 6b of the silicon wafer 6.

The provision of the subsidiary heater 8 not only reduces the radiation of heat from the peripheral part 6b of the silicon wafer 6 but also, on the contrary, applies heat to the peripheral part 6b to compensate any temperature drop at the peripheral part 6b. As the subsidiary heater 8, may be employed, for example, an annular halogen lamp, an annular metallic member having a high melting point which radiates heat on receiving the light or the like.

(3) To displace halogen lamps positioned at the peripheral parts of the upper and lower plane light sources inwardly in the vertical direction of the light-heating space 10, in other words, closer to the silicon wafer 6 or to supply a greater power to halogen lamps positioned at the peripheral parts of the upper and lower plane light sources than the remaining halogen lamps.

The above means (3) can bring about the same effects as the means (2).

Having generally described the invention, a more complete understanding can be obtained by reference to certain specific examples, which are provided herein for purposes of illustration only and are not intended to be limiting unless otherwise specified.

EXAMPLE 1

A silicon nitride ($Si_3N_4$) film of 0.2 μm thick was formed on a surface of a wafer made of an Si single crystal and having a diameter of 10 cm and a thickness of 0.45 mm and aluminum ions, which had been accelerated with an energy of 320 KeV, were implanted to a concentration of $8 \times 10^{15}$ ions/cm$^2$ through the film, thereby obtaining a wafer in which a junction was formed at a depth of 3 μm with an aluminum-doped layer. When the thus-obtained silicon wafer was heated by applying light thereonto in a light-heating furnace of the same construction as shown in FIG. 1, the temperatures of the central part and peripheral part of the silicon wafer 6 were raised respectively to 1350° C. and 1335° C. Upon continuing the application of light for 3 minutes under the above conditions, aluminum atoms implanted were caused to undergo diffusion and the depth of the junction was increased to 5 μm. No development of physical defects such as slip lines was observed.

EXAMPLE 2

Ion implantation into a silicon wafer was effected in the same manner as in Example 1 except that gallium ions, which had been accelerated with an energy of 350 KeV, were implanted to a concentration of $3 \times 10^{15}$ ions/cm$^2$. When light was applied onto the thus-obtained wafer in the same manner as in Example 1, the wafer was heated to 1350° C. at its central part and 1345° C. at its peripheral part. Upon continuing the application of light for 20 minutes under the same conditions, gallium atoms were caused to undergo diffusion and the depth of the junction was increased to 5 μm. No development of physical defects such as slip lines was observed.

EXAMPLE 3

A film of phosphorus trioxide having a thickness of 0.4 μm was formed on a silicon wafer of the same type as that used in Example 1. When the silicon wafer was exposed to light in the same manner as in Example 1, the wafer was heated to 1350° C. at its central part and 1330° C. at its peripheral part. After continuing the application of light under the same conditions for 45 minutes, phosphorus atoms had undergone solid-phase diffusion, thereby providing a wafer having a junction formed at a depth of 5 μm with a phosphorus-doped layer. Similar results were brought about when a silicon wafer applied with a film of phosphorus glass in place of the film of phosphorus trioxide.

As understood from the above description, the present invention has made it possible to complete each diffusion treatment in a relatively short period of time because a silicon wafer is heated by applying light thereonto so as to diffuse dopant atoms into the interior of the silicon wafer. Since the heating of a silicon wafer is carried out in the present invention under such conditions that the temperature difference between the central part of the silicon wafer and its peripheral part does not exceed 65° C., the silicon wafer does not develop such physical defects as warping or slip lines. Accordingly, the method of the present invention can diffuse dopant atoms to a significantly greater junction depth in a shorter period of time and can fabricate doped silicon wafers with higher productivity, compared with the conventional heating method which makes use of a resistance furnace.

Having now fully described the invention, it will be apparent to one of ordinary skill in the art that many changes and modifications can be made thereto without departing from the spirit or scope of the invention as set forth herein.

What is claimed is:

1. A method for diffusing dopant atoms into a silicon wafer, which method comprises heating the entirety of said silicon wafer with said dopant atoms to a predetermined diffusing temperature in a short period of time by applying light thereonto under such conditions that the temperature difference between a central part of said silicon wafer and a peripheral part thereof is maintained within 65° C., thereby causing said dopant to undergo thermal diffusion into the interior of said silicon wafer.

2. A method as claimed in claim 1, wherein the light is applied from an upper and lower plane light sources disposed respectively above and below said silicon wafer and each of said plane light sources is constructed of a reflector and a number of halogen lamps arranged close to one another between said reflector and the silicon wafer.

3. A method as claimed in claim 2, wherein said plane light sources have areas wider than said silicon wafer and the application of the light is carried out while holding said silicon wafer in face-to-face relationship with central regions of said plane light sources.

4. A method as claimed in claim 2, wherein halogen lamps arranged along the peripheries of their corresponding plane light sources are closer to the level at which said silicon wafer is held, compared with the remaining halogen lamps.

5. A method as claimed in claim 2, wherein halogen lamps arranged along the peripheries of their corresponding plane light sources are operated with a power consumption greater than the remaining halogen lamps.

6. A method as claimed in claim 1, wherein the light is applied to said silicon wafer which is held within a transparent container.

7. A method as claimed in claim 1, wherein the application of the light is carried out while additionally heating the peripheral part of said silicon wafer by means of a subsidiary heater arranged along the peripheral part of said silicon wafer.

8. A method as claimed in claim 1, wherein said dopant atoms have in advance been introduced in said silicon wafer by the ion implantation process.

9. A method as claimed in claim 8, wherein the dopant atoms are aluminum or gallium.

10. A method as claimed in claim 1, wherein a material containing said dopant atoms have in advance been applied on said silicon wafer.

* * * * *